(12) United States Patent
Fukushima et al.

(10) Patent No.: US 7,494,931 B2
(45) Date of Patent: Feb. 24, 2009

(54) METHOD FOR FABRICATING SEMICONDUCTOR DEVICE AND POLISHING METHOD

(75) Inventors: Dai Fukushima, Kanagawa (JP); Gaku Minamihaba, Kanagawa (JP); Hiroyuki Yano, Kanagawa (JP); Nobuyuki Kurashima, Kanagawa (JP); Susumu Yamamoto, Oita (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/526,671

(22) Filed: Sep. 26, 2006

(65) Prior Publication Data

US 2007/0072427 A1 Mar. 29, 2007

(30) Foreign Application Priority Data

Sep. 29, 2005 (JP) .............................. 2005-283227

(51) Int. Cl.
*H01L 21/302* (2006.01)
(52) U.S. Cl. ....................................... 438/692; 451/287
(58) Field of Classification Search ................ 438/689, 438/690, 691, 692; 451/6, 287, 288
See application file for complete search history.

(56) References Cited

U.S. PATENT DOCUMENTS

| | | | |
|---|---|---|---|
| 6,004,196 A * | 12/1999 | Doan et al. .................. 451/443 |
| 6,300,248 B1 * | 10/2001 | Lin et al. .................... 438/692 |
| 6,341,998 B1 * | 1/2002 | Zhang .......................... 451/41 |
| 6,368,981 B1 * | 4/2002 | Sugai et al. .................. 451/56 |
| 6,387,188 B1 * | 5/2002 | Laursen et al. ................. 134/3 |
| 6,720,250 B2 | 4/2004 | Minamihaba et al. |
| 6,773,337 B1 * | 8/2004 | Dabral et al. ................. 451/56 |
| 6,793,797 B2 * | 9/2004 | Chou et al. ................. 205/103 |
| 2002/0108861 A1 * | 8/2002 | Emesh et al. ................. 205/81 |
| 2004/0203321 A1 * | 10/2004 | Tsuchiyama et al. ........... 451/6 |

FOREIGN PATENT DOCUMENTS

JP 2001-203178 * 7/2001

OTHER PUBLICATIONS

S. Wolf, "Silicon Processing for the VLSI Era", Lattice Press, vol. 4, p. 747.*

* cited by examiner

*Primary Examiner*—Kin-Chan Chen
(74) *Attorney, Agent, or Firm*—Finnegan, Henderson, Farabow, Garrett & Dunner, L.L.P.

(57) ABSTRACT

A method for fabricating a semiconductor device includes forming a copper film above a surface of a substrate, forming on a polishing pad a material which contains copper, wherein said copper does not derive from said copper film, and after having formed the copper-containing material on said polishing pad, polishing said copper film by use of said polishing pad.

16 Claims, 13 Drawing Sheets

526 : Bubble    525

526 : Bubble    527 : Cu Particle    525

530 : Feed Nozzle
510 : Carrier
540 : Polish Liquid
300 : Substrate
525 : Polishing Pad
520 : Turn Table

METHOD FOR FABRICATING SEMICONDUCTOR DEVICE AND POLISHING METHOD

CROSS-REFERENCE TO RELATED APPLICATION

This application is based upon and claims the benefit of priority from prior Japanese Patent Application No. 2005-283227, filed on Sep. 29, 2005 in Japan, the entire contents of which are incorporated herein by reference.

BACKGROUND OF THE INVENTION

1. Field of the Invention

The present invention relates to a method for making semiconductor devices and a polishing method, and more particularly to a semiconductor device fabrication method having a process of polishing a high conductivity film, e.g., a copper (Cu) film.

2. Related Art

In recent years, the quest for higher integration and performance in semiconductor integrated circuit (LSI) devices brings development of new microfabrication technologies. Especially, in order to achieve enhanced speed performance of LSI, an attempt is made to change metal wiring material from traditional aluminum (Al) alloys to copper (Cu) or Cu alloys of low electrical resistance (these will be collectively referred to as "Cu" hereinafter). As Cu is difficult in microfabrication by dry etching techniques which have been frequently used in the formation of Al alloy wires, the so-called "damascene" method is mainly employed, which has the steps of depositing a Cu film on a dielectric film with grooves defined therein and then applying thereto chemical-mechanical polishing (CMP) to remove extra portions of the Cu film other than its groove-buried parts to thereby form a pattern of buried wires. A general approach to forming the Cu film is to form a thin seed layer by sputtering and thereafter form by electrolytic plating methods a multilayer film having a thickness of about several hundred of nm. Alternatively, in the case of forming a multilayered Cu wiring pattern, another wire-forming method is usable, which fabricates wires of the type having the so called "dual damascene" structure. In this method, deposit a dielectric film on an underlayer wire. Then, define therein openings, known as via holes, and wiring grooves for the upper-layer wire use, called the trenches. Thereafter, bury a wiring material, such as Cu, to fill both the via holes and the trenches at a time. Next, remove by CMP unnecessary surface portions of the buried Cu for planarization, thereby forming the intended buried wires.

Recently, consideration is given to use as an interlayer dielectric film an insulative material with low dielectric constant, k, which is called the "low-k" film. More specifically, the industry faces challenges for further reduction of the parasitic capacitance between adjacent interconnect wires by replacing traditional silicon dioxide ($SiO_2$) films having a dielectric constant k of about 4.2 by a low-k film with its dielectric constant of 3.5 or less, by way of example.

However, most low-k films have a porous structure in order to achieve low dielectric constants and are thus poor in mechanical strength so that these films can sometimes experience unwanted occurrence of exfoliation or peel-off of a Cu film during CMP process thereof. Such Cu-film peel-off makes it almost impossible to form any intended wires.

The film peel-off and the destruction of a film per se pose serious problems for, in particular, advanced high-performance LSIs of the next generation since these LSIs are designed to use low-k films in order to reduce resistance-capacitance (RC) delays. To avoid such problems, a need is felt to employ a specific polish technique with low friction and increased stability—preferably, without temperature rise-up.

To improve throughputs in microfabrication processes, it is desirable to improve the polishing rate of a Cu film. However, such Cu polish rate increase results in an increase in friction between a polishing pad and the Cu film being polished. This friction increase leads to a further increase of the risk of Cu film peel-off.

Additionally, in order to preclude Cu diffusion into a low-k film, it is a usual approach to form a barrier metal film made of tantalum (Ta) between a Cu film and low-k film. This barrier metal film also is applied CMP planarization by removal of its unnecessary portions. A technique relating to the polishing of such barrier metal film is disclosed, for example, in JP-A-2001-203178. This Japanese patent bulletin teaches a process of polishing a barrier metal film while at the same time dropping down a Cu ionic solution along with a flow of slurry in order to improve the polishing rate of the barrier metal film.

BRIEF SUMMARY OF THE INVENTION

In accordance with one aspect of the present invention, a method for fabricating a semiconductor device is provided, which includes forming a copper film above the surface of a substrate, forming on a polishing pad a material which contains therein copper that does not derive from the copper film, and, after having formed the copper-containing material on the polishing pad, polishing the copper film by use of the polishing pad.

In accordance with another aspect of this invention, a fabrication method of a semiconductor device includes plating a copper film above a surface of a substrate by using a copper-containing plating liquid, supplying the copper-containing plating liquid and a prespecified chemical liquid onto a polishing pad, and, after having supplied of the copper-containing plating liquid and the chemical liquid, using the polishing pad to polish the copper film as plated on the substrate surface.

In accordance with a further aspect of the invention, a polishing method includes forming a copper-containing material on a polishing pad, and, after having formed the copper-containing material on the polishing pad, using the polishing pad to start sequential surface polishing of a plurality of substrates which have a substantially identical structure, with a copper film being formed above a surface thereof.

DETAILED DESCRIPTION OF THE INVENTION

Embodiment 1

In Embodiment 1, an explanation will be given of either a polishing method or a semiconductor device fabrication method, wherein the former is for preventing the occurrence of exfoliation or "peel-off" of a film on or above a substrate.

Upon practical implementation of Cu interconnect wires, it is required to perform a combination of first metal polishing and second metal polishing. The first metal polishing is such that its Cu polishing rate is set, for example, to 1000 nm/min or greater for causing the polishing treatment to stop at the level of a barrier metal film while at the same time suppressing Cu's dishing to less than 20 nm. The second metal polishing is for applying touch-up polishing to the barrier metal film while reducing the Cu dishing and the erosion of a dielectric film to 20 nm or less, for example. In Embodiment 1 below, an explanation will be given with emphasis on the first metal polishing, in particular.

Embodiment 1 will be described with reference to some of the accompanying drawings below.

Figure 1:
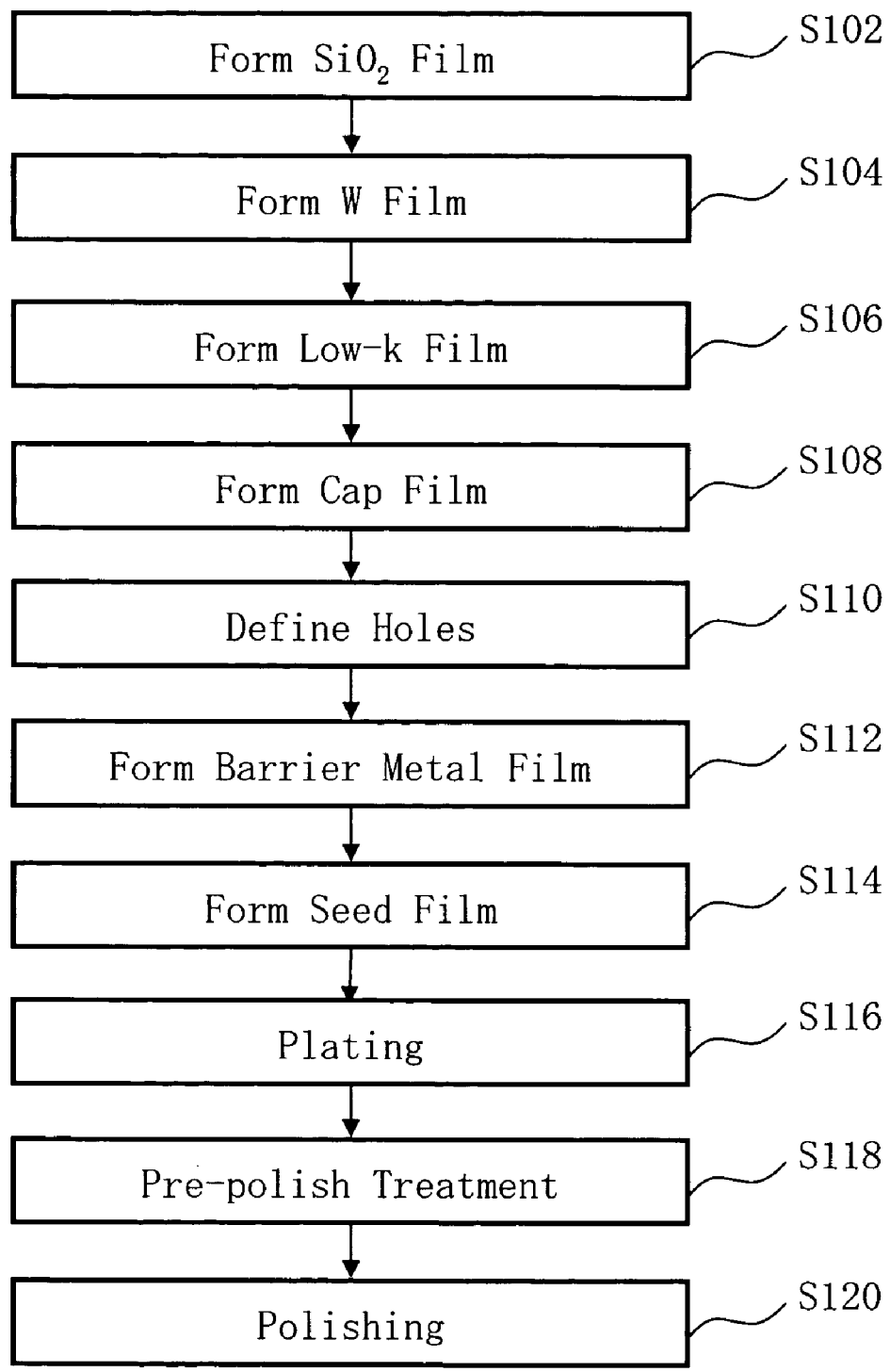
FIG. 1 is a flow chart showing major process steps of a semiconductor device fabrication method in Embodiment 1.

FIG. 1 is a flow chart showing some major process steps of a semiconductor device fabrication method in Embodiment 1.

As shown in FIG. 1, the method of this embodiment performs a series of processes including a step S102 of forming a thin film of $SiO_2$, a step S104 which forms a thin film of tungsten (W), a step S106 which forms a thin film of a low dielectric constant or "low-k" insulative material, a step S108 which forms a thin film of cap film, a step S110 which defines openings or holes, a step S112 which forms a barrier metal film that is an example of a thinfilm of electrical conductive material, a seed film forming step S114, a plating step S116 which is an example of a copper (Cu) film forming step, a pre-polishing treatment step S118 which exemplifies either a supply step or a copper-containing material forming step, and a polishing step S120.

Figure 2A:
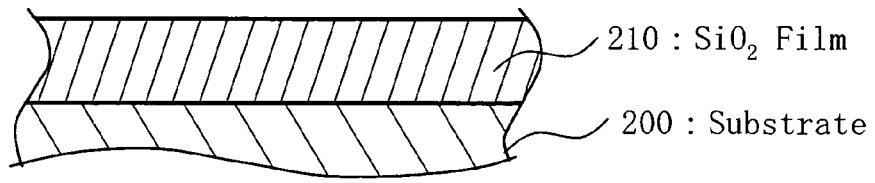
FIGS. 2A to 2C are process cross-section diagrams showing some processes to be implemented in a way corresponding to the flow chart of FIG. 1.
Figure 2B:
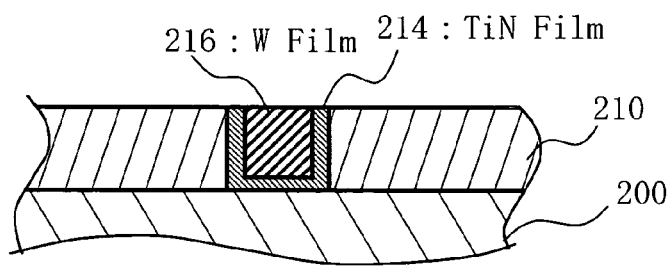
Figure 2C:
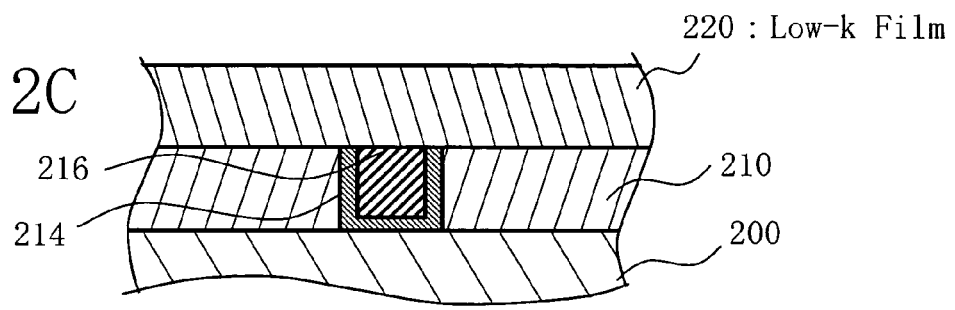

FIGS. 2A to 2C illustrate, in cross-section, some of the processes to be implemented in a way corresponding to the flowchart of FIG. 1.

FIGS. 2A-2C show the $SiO_2$ film forming step S102 up to the low-k film forming step S106. The remaining process steps will be described later.

As shown in FIG. 2A, at the $SiO_2$ film forming step, a thin film of $SiO_2$ is deposited by chemical vapor deposition (CVD) techniques on the top surface of a substrate 200 to a predetermined thickness of, for example, about 500 nm, thereby forming an $SiO_2$ film 210 for later use as a dielectric film. An example of the substrate 200 is a silicon wafer having a diameter of 200 mm. Note here that those integrated circuit elements to be formed thereon, i.e., device parts, are omitted from the illustration.

As shown in FIG. 2B, at the W film forming step, openings which become via holes that extend to reach the device parts are selectively defined in the $SiO_2$ film 210, although only one of them is depicted herein for illustration purposes. Then, a thin film of titanium nitride (TiN) is selectively deposited as a barrier metal on sidewalls and bottom faces of the holes. Thereafter, a tungsten (W) thin-film is buried to fill the holes, thereby to form electrical interlevel plugs. The holes are defined by etching. The TiN film 214 and W film 216 are formed by CVD techniques. Chemical-mechanical polishing (CMP) may be used to remove extra portions of the TiN film 214 and W film 216, which portions are deposited on the film surface other than the holes.

In FIG. 2C, at the low-k film forming step, a low-k film 200, i.e., a thinfilm of porous low-dielectric-constant insulator material, is formed on the $SiO_2$ film 210 that was formed on the substrate 200, to a thickness of 80 nm for example. Forming the low-k film 220 makes it possible to obtain an interlayer dielectric film having its dielectric constant k of 3.5 or below. Here, as an example, the low-k film 220 is formed by use of a low-k dielectric (LKD) material that is commercially available from JSR Corporation, which material comprises polymethylsiloxane with its relative dielectric constant of less than 2.5. Other examples of the material of low-k film 220 in addition to polymethylsiloxane include, but not limited to, a film having the siloxane backbone such as polysiloxane, hydrogen silses-quioxane and methylsilsesquioxane, a film containing as its main component an organic resin such as polyarylene ether, polybenzoxazole or polybenzocyclobutene, and a porous film such as a porous silica film. Using any one of these LKD materials makes it possible for the low-k film 220 to have the relative dielectric constant of less than 2.5. An exemplary approach to forming such film is to use the so-called spin-on-dielectric (SOD) coating method which forms a thin film through spin coating of liquid solution and thermal processing applied thereto. For instance, the film fabrication is achievable in a way such that a wafer with a film being formed thereon by a spinner is baked on a hot plate in a nitrogen-containing atmosphere and is finally subjected to curing on the hot plate at a temperature higher than the baking temperature. By appropriately choosing the low-k material and properly adjusting film forming process conditions, it is possible to obtain the aimed porous dielectric film having a prespecified physicality value(s).

Figure 3A:
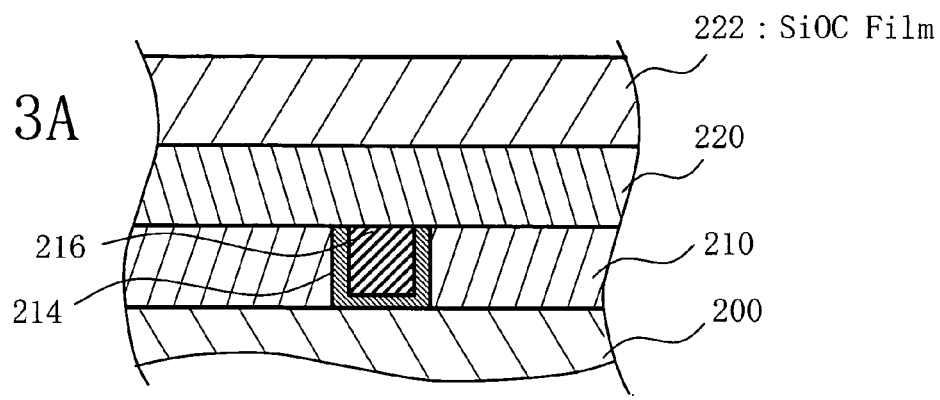
FIGS. 3A to 3C are process cross-section diagrams showing processes to be performed in a way corresponding to the flowchart of FIG. 1.
Figure 3B:
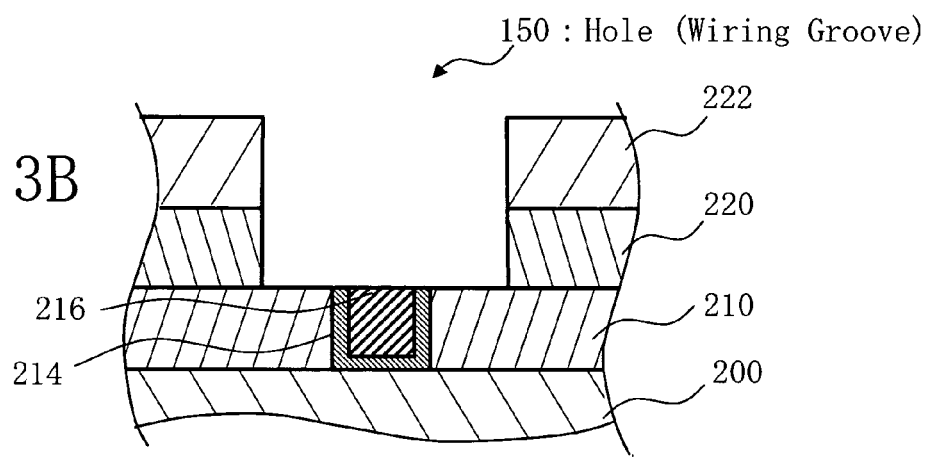
Figure 3C:
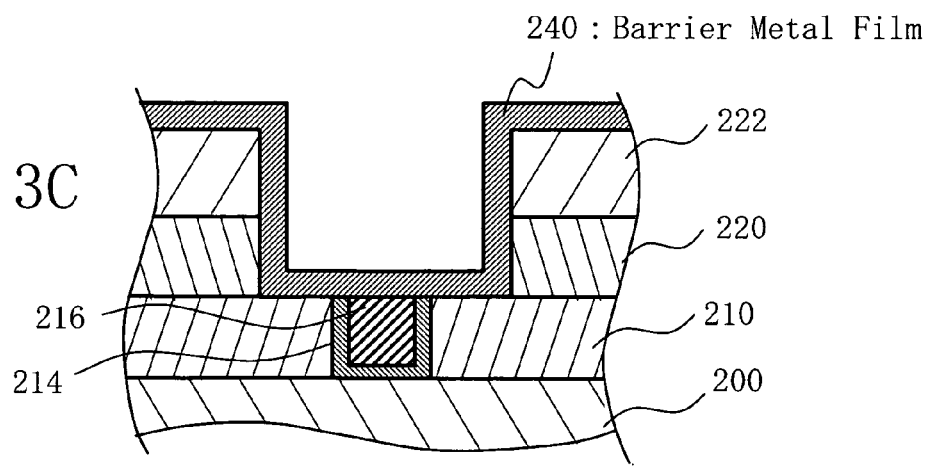

FIGS. 3A to 3C illustrate, in cross-section, some process steps to be performed in a way corresponding to the flowchart of FIG. 1.

In FIGS. 3A-3C, there are depicted the cap film forming step S108 up to the barrier metal film forming step S112 of FIG. 1. The other steps will be set forth later.

As shown in FIG. 3A, at the cap film forming step, a layer of silicon oxycarbide (SiOC) is deposited by CVD as a cap insulator film on the low-k film 220 to a thickness of 160 nm, for example, thereby forming a thin-film of SiOC film 222. Forming the SiOC cap film 222 makes it possible to protect its underlying low-k film 220 that is difficult to be directly applied lithography, and thus enables formation of a pattern in the low-k film 220. Examples of the cap insulator film material other than SiOC are dielectric materials with a dielectric constant of 2.5 or greater, as selected from the group consisting essentially of tetra-ethoxy-silane (TEOS), SiC, silicon carbohydride (SiCH), silicon carbonitride (SiCN) and SiOCH. Although the film fabrication is done here by CVD, other similar methods are alternatively be employable.

In FIG. 3B, at the hole forming step, holes including an illustrative hole 150 that is a wiring groove structure for fabrication of damascene wires are defined by lithography and dry etch techniques in the SiOC film 222 and low-k film 220. The holes are formed to have a depth corresponding to a total thickness of SiOC film 222 and low-k film 220-for example, 240 nm deep. For the substrate 200 with a resist film being formed on the SiOC film 222 through resist deposition and lithography processes such as exposure (not shown), the exposed SiOC film 222 and its underlying low-k film 220 are selectively removed away by anisotropic etch techniques with the $SiO_2$ film 210 as an etch stopper, thereby to define the hole 150. Use of the anisotropic etching makes it possible to define the hole 150 so that it has almost vertical inner wall relative to the surface of substrate 200. An example of such anisotropic etching for forming the hole 150 is a reactive ion etching (RIE) technique.

In FIG. 3C, at the barrier metal film forming step, a barrier metal film 240 which is made of a chosen barrier metal material is formed in the hole 150 that was defined by the opening forming process and also on a surface of the SiOC film 222. Within a sputtering apparatus using a sputter technique which is one of physical vapor deposition (PVD) methods, a thin film of titanium (Ti) is deposited to a thickness of 10 nm for example, thereby forming the barrier metal film 240. The deposition of the barrier metal material is achievable not only by PVD but also by CVD methods, such as for example atomic layer deposition (ALD) or atomic layer chemical vapor deposition (ALCVD). In the latter case, it is possible to improve the coverage ratio so that it is better than that in the case of using PVD methods. Additionally the material of barrier metal film is not exclusively limited to Ti. This film may alternatively be made of tantalum (Ta), tantalum nitride (TaN), tungsten (W), titanium nitride (TiN) or tungsten nitride (WN) or may be a multilayer film made of more than two of these materials in combination, such as Ta and TaN or else.

Figure 4A:
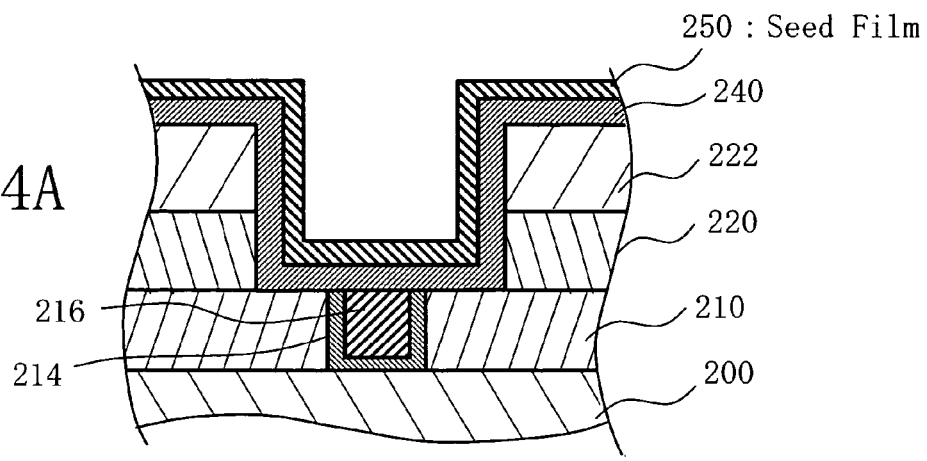
FIGS. 4A to 4C are process cross-section diagrams showing processes to be done in a way corresponding to the flowchart of FIG. 1.
Figure 4B:
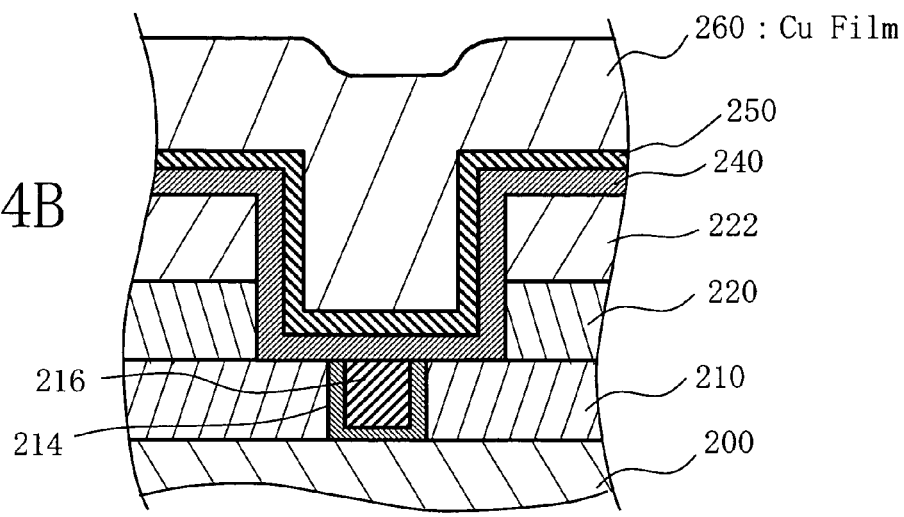
Figure 4C:
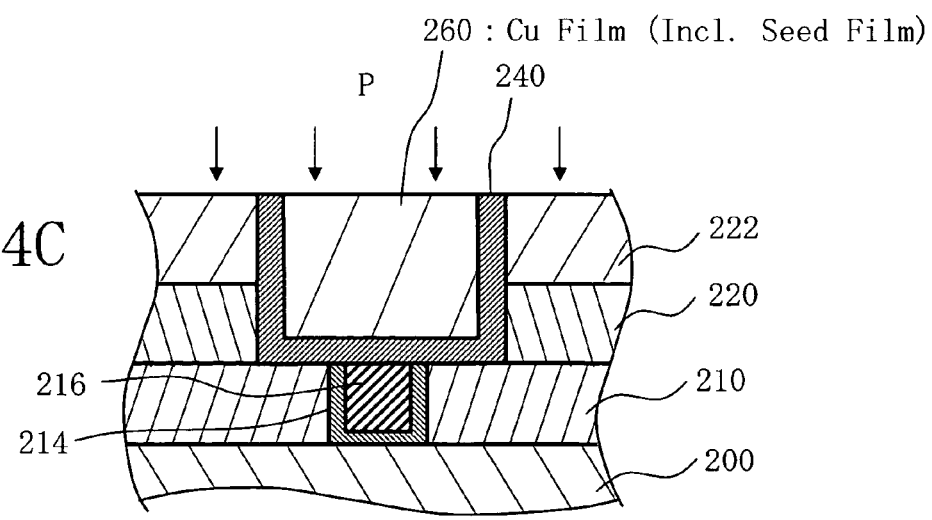

FIGS. 4A to 4C illustrates, in cross-section, some processes to be implemented in a way corresponding to the flowchart of FIG. 1.

FIGS. 4A-4C show process steps of from the seed film forming step S114 to the polishing step S120 of FIG. 1.

As shown in FIG. 4A, at the seed film forming step, a Cu thin-film is deposited (formed) as a seed film 250 by PVD, such as sputtering or else, on the inner wall of the hole 150 with the barrier metal film 240 formed thereon and also on the surface of substrate 200. This thinfilm will become a cathode pole for use in the next-executed electrolytic plating process. Here, the seed film 250 is formed to have a thickness of 50 nm, for example.

In FIG. 4B, at the plating step, an electrochemical growth method such as electrolytic plating or else is used to deposit, with the seed film 250 being as the cathode pole, a thin film 260 of Cu in the hole 150 and on the surface of substrate 200. Here, the Cu film 260 is deposited to a thickness of 1200 nm. Thereafter, annealing treatment is performed at a temperature of 250° C. for 30 minutes, for example.

Here, a plurality of (e.g., 25) substrates 200 are grouped together in a single lot, each of which is fabricated through the respective processes stated supra.

Figure 5:
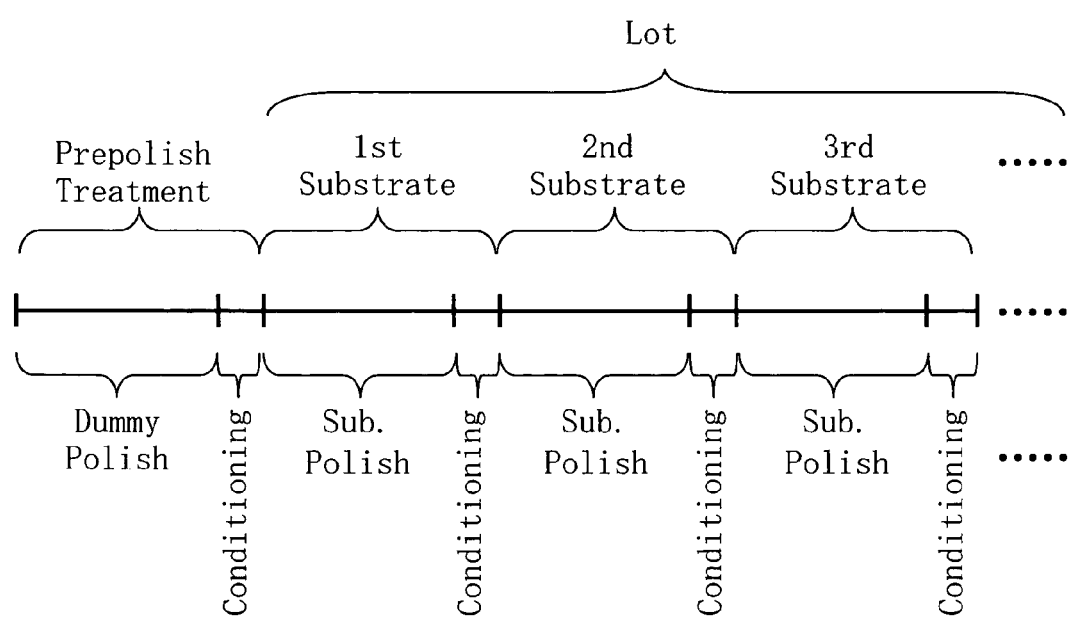
FIG. 5 is a diagram for explanation of the flow of a pre-polishing treatment process and its following polishing processes of substrates under lot production.

FIG. 5 is a diagram for explanation of the flow of a pre-polishing treatment process and a sequence of polishing processes of substrates under lot production.

Prior to CMP polishing of extra portions of the Cu film 260 which are protruded from holes 150 of each substrate 200, a dummy polish process and a conditioning process are carried out at the pre-polishing treatment step S118, wherein the former is to perform dummy polishing by use of a dummy substrate such as for example a readily preparable and repeatedly usable silicon (Si) or a wafer having its surface on which a silicon oxide film is formed whereas the latter is for fabric raising or "refreshing" of a polishing pad. Then, substrate polishing and conditioning processes will be repeatedly applied, in an alternate fashion, to a plurality of sample substrates 200 which belong to the same lot of products in an ascending order of substrate numbers, i.e., the first, second, third, et seq.

At the pre-polishing treatment step S118, a copper-containing material is formed on the polishing pad of a polishing apparatus.

Figure 6:
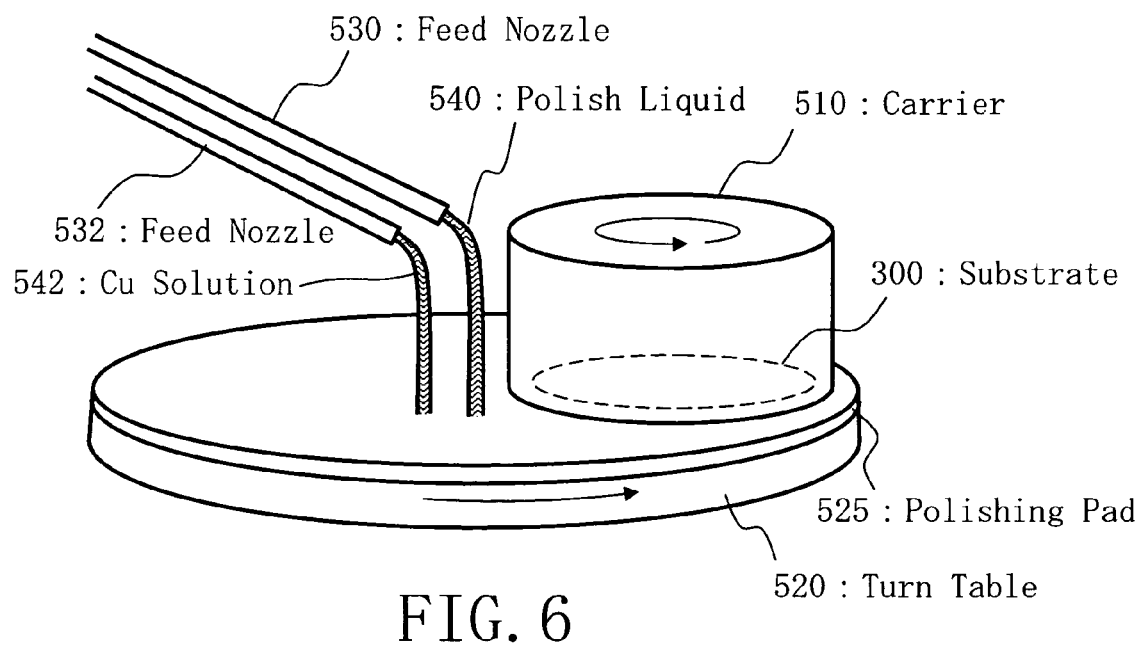
FIG. 6 is a conceptual diagram showing an arrangement of a chemical-mechanical polishing (CMP) apparatus.

FIG. 6 is a perspective view of a structure of chemical-mechanical polish (CMP) equipment.

This equipment is of the type having a rotary table unit shown in FIG. 6. As shown herein, the rotary CMP equipment has a turn table 520 having a round top surface on which a polishing pad 525 and a carrier 510 are disposed. The carrier 510 supports a dummy substrate 300 while causing its to-be-polished surface to face downward. After having supplied pure water from a water feed nozzle (not shown) onto the polishing pad 525 to flow thereon, a polishing liquid 540 which is an example of the chemical liquid as claimed is supplied from a feed nozzle 530 while simultaneously supplying a Cu solution 542 from a supply nozzle 532. Rotating the carrier 510 causes the substrate 300 to rotate, thus driving the turn table 520 to rotate. The polish liquid 540 and Cu solution 542 are fed to drop down onto the polishing pad 525 at specific positions that are adjacent to a near side of the substrate 300 which is positioned at a far end along the rotation direction of turn table 520 whereby the polish liquid 540 and Cu solution 542 are supplied to the surface of substrate 300. Performing the dummy polishing makes it possible to force the polish liquid 540 and Cu solution 542 to spread (diffuse) to uniformly cover or "coat" the entire surface of the polishing pad 525. After having completed the dummy polishing using the polish liquid 540 and Cu solution 542, pure water is fed from the water feed nozzle (not shown) to flow on the surface of polishing pad 525 for replacement of the polish liquid 540 and Cu solution 542.

Figure 7:
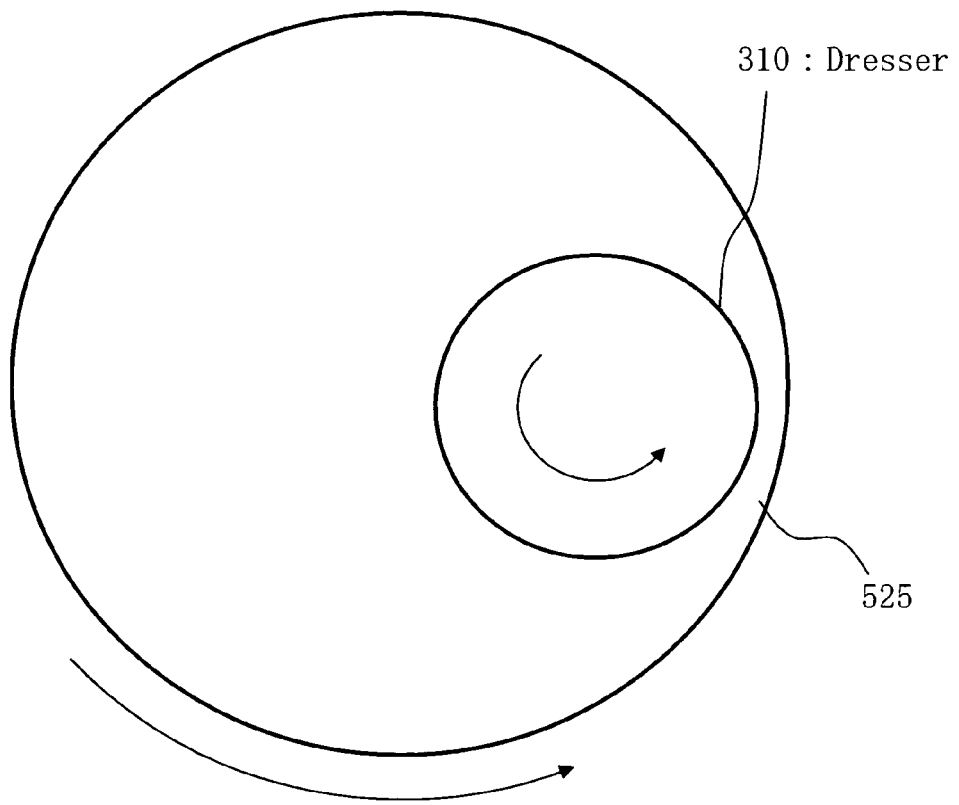
FIG. 7 is a conceptual diagram for explanation of a way of conditioning.

FIG. 7 shows a plan view of the polishing pad 525 for explanation of the way of performing the conditioning.

After completion of the dummy polishing using the polish liquid 540 and Cu solution 542, the conditioning is done in such a way that a fabric conditioning tool 310, known as a "dresser," of the CMP equipment is driven to spin and come into pressed contact with the top surface of the rotating polishing pad 525 to thereby perform fabric raising of the cloth 525, which is in a clogged condition due to execution of the dummy polishing.

Figure 8:
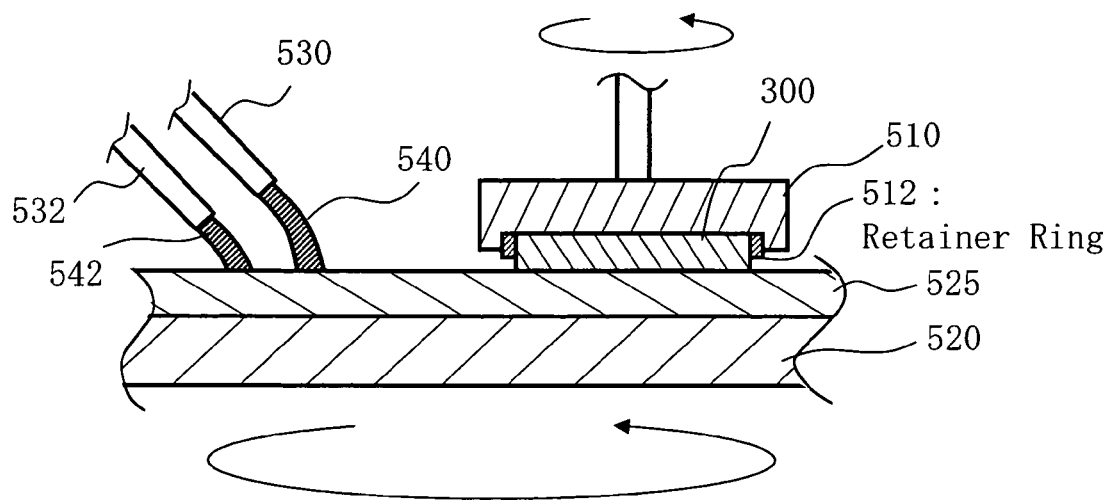
FIG. 8 is a conceptual diagram showing a cross-sectional structure of the CMP apparatus shown in FIG. 6.

FIG. 8 shows a cross-sectional view of the turn table structure of CMP equipment shown in FIG. 6.

The turn table 520 padded with the polishing pad 525 is driven to rotate at a rate of 10 to 150 revolutions per minute (rpm) and simultaneously come into contact with the polishing pad 525 with the aid of the carrier 510 that holds the substrate 300 with application of a polishing load P of $9.8 \times 10^3$ to $6.9 \times 10^4$ Pa (100 to 700 gf/cm$^2$). The carrier 510's rotation number was set to 10 to 120 rpm, or min$^{-1}$. The polish liquid 540 was supplied from the feed nozzle 530 onto the polishing pad 525 with a flow rate of 0.05 to 0.3 liters per minute (L/min), i.e., 50 to 300 cc/min. The Cu solution 542 was supplied from the feed nozzle 532 at a flow rate of 0.005 to 0.2 L/min (5 to 200 cc/min). The polishing pad 525 used was Rodel IC1000. The polishing time was set to a time duration capable of entirely removing, by polishing, the Cu film 260 and its underlying film 250 above the surface of substrate 200 at a first metal polish process to be later executed. In addition, over-polishing of +30% was carried out.

An example of the polish liquid 540 is a mixture of 0.3 weight percent (wt %) of quinaldic acid which acts as a complex creation agent, 0.1 wt % of organic acid, e.g., oxalic acid, 0.6 wt % of colloidal silica which becomes abrasive particles, 0.05 wt % of polyoxyethylene-alkyl-ether acting as an interfacial activator or "detergent," and 1.5 wt % of ammonium persulfate for use as an oxidizer, which are blended with pure water. This blended polish liquid is adjusted by potassium hydroxide (KOH) to a level of pH9. An example of the Cu solution 542 is a chemical solution which contains 0.2 wt % of copper sulfate.

Figure 9:
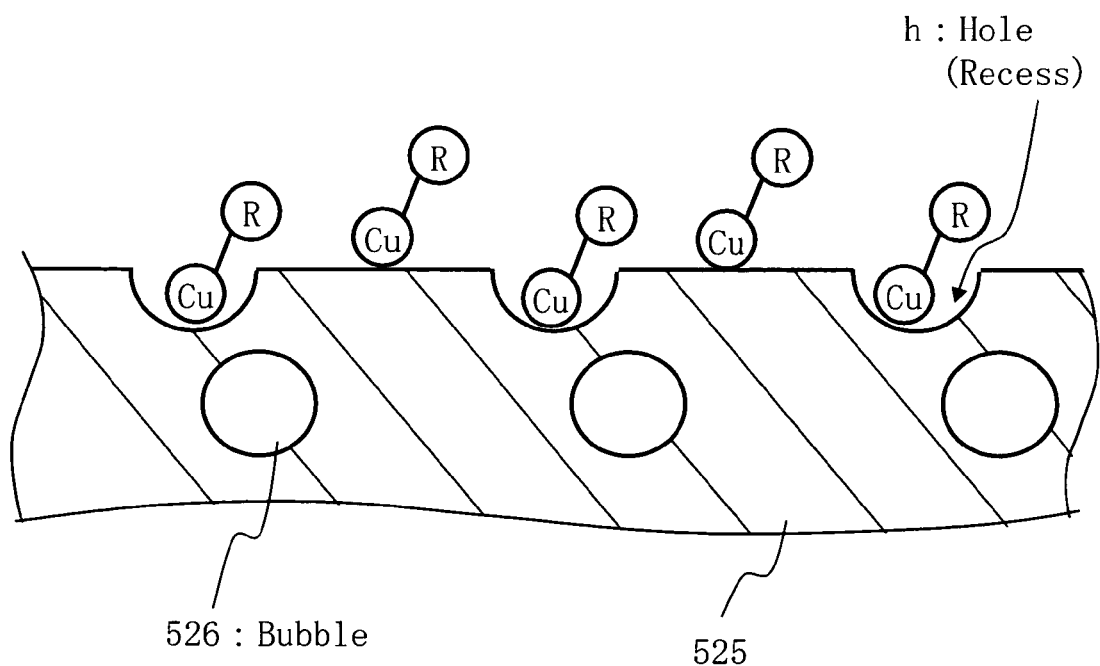
FIG. 9 is a conceptual diagram showing a cross-section of a polishing pad.

FIG. 9 is a pictorial representation of a partial cross-section of the polishing pad 525 used for the Cu polishing.

The polishing pad 525 is made, for example, of a polyurethane-based material, which has therein gas bubbles 526 with a size of 50 to 100 µm. In a surface of the polishing pad 252 as cut along a certain plane, holes h (recesses or "pore") are formed due to outward release of gas bubbles 526. When rotating the carrier 510 and turn table 520 while supplying the polish liquid 540 and Cu solution 542 onto the polishing pad 525, such liquids 540 and 542 uniformly coat the entire surface of the polishing pad 525 with the aid of the substrate 300. And, Cu molecules in the copper sulfate solution react with the quinaldic acid acting as the complex-forming agent in the polish liquid 540, resulting in adequate creation of water-insoluble Cu complexes (Cu—R)—i.e., an example of the Cu-containing material—on the polishing pad 525 as shown in FIG. 9.

Figure 10:
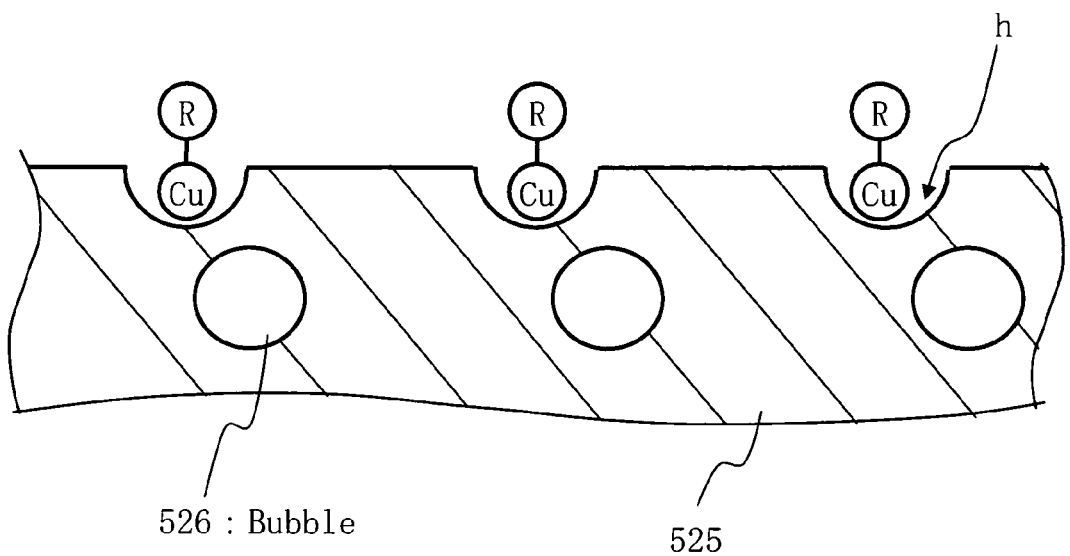
FIG. 10 is a conceptual diagram showing a cross-section of the polishing pad after the conditioning.

FIG. 10 pictorially shows a partial cross-section of the polishing pad 525 after completion of the conditioning process.

Due to the conditioning after the dummy polishing, almost entire part of the Cu-containing material-here, Cu complexes (Cu—R)—is removed away from the surface of the polishing pad 525 while few portions thereof reside within the surface recesses h of this polishing pad 525 in a state that these are precipitated at the bottom faces of such recesses as shown in FIG. 10. In this state, surface polishing is applied to the substrate 200, which is a sample of the lot products.

Turning back to FIG. 4C, at the first metal polishing which is part of the polishing step S120 of FIG. 1, the substrate 200 is surface-polished by CMP techniques in such a way that the polishing stops at the barrier metal film 240 while controlling the Cu polish rate to stay at 1000 nm/min, for example, and also suppressing Cu's dishing at 20 nm or less, thereby to remove the Cu film 260 and seed film 250 as have been deposited on those surface portions of the SiOC film 222 other than the holes. The surface polish conditions of the substrate 200 that is a sample of the lot products are similar to those in the dummy polishing, except that the Cu solution 542 is not supplied from the feed nozzle 532, so repetitive explanations are eliminated herein.

Note here that in a process of polishing an oxide film as a dummy substrate without the supply of the Cu solution 542 and polishing Cu-added sample substrates in succession, unwanted film exfoliation or "peel-off" has often occurred in samples immediately after execution of the dummy polishing. Generally speaking, in the lot production of semiconductor devices, the Cu film peel-off takes place during polishing of the first substrate in many cases. One research result suggests that such film peel-off occurs with the probability of 24.2%. A value of friction resistance between the dummy-polished sample substrate 200 and the polishing pad 525, which was measured as the current value for rotation of the turn table 520, is ten amperes (10 A).

In contrast, with the embodiment method for polishing an oxide film on a dummy substrate while supplying the Cu solution 542 and then polishing Cu-added sample substrates in succession, no film peel-off was occurred. The friction resistance value measured was 8A as a current value for rotation of the turn table 520. This demonstrates that the friction resistance between the substrate 200 and polishing pad 525 is reducible by having formed Cu complexes (Cu—R) as the copper-containing material on the polishing pad 525 with the supply of the polish liquid 540 and Cu solution 542 prior to the polishing of Cu on the substrate 200 that is a sample of the lot products. The friction resistance reduction makes it possible to suppress or minimize the risk of film peel-off. Furthermore, unlike the case of lowering the friction resistance between the substrate 200 and polishing pad 525 by a scheme for reducing the polishing load per se, the intended film peel-off suppressibility is attainable without having to slow down the Cu polish rate.

After having completed the surface polishing of the first substrate 200 and the conditioning for fabric raising of the polishing pad 525, a set of surface polishing and conditioning processes is applied to a second substrate 200 in the lot, followed by execution of a set of similar processes in succession for a third substrate 200. The same goes with the remaining substrates in the lot so that each substrate of the lot is surface-polished sequentially. Even in the polishing processes of the second substrate 200 and third substrate 200 et seq., the Cu complexes (Cu—R) are expected to remain at the bottoms of the surface recesses h of polishing pad 525 as shown in FIG. 10. Thus it is possible to suppress unwanted film peel-off without having to perform the dummy polishing while intentionally supplying thereto the polish liquid 540 and Cu solution 542.

It should be noted here that the polishing of the first substrate 200 gets started within a predetermined length of time period—e.g., four to six minutes—after completion of the dummy polishing from a viewpoint of avoiding degradation change in quality of the Cu complexes thus created. In case a longer period of time is elapsed, it is preferable that the dummy polishing with the supply of the polish liquid 540 and Cu solution 542 is again performed, followed by the start-up of the polishing of the first substrate 200 within the predetermined length of time period since then. Regarding the polishing of the second substrate 200 et seq., it is preferably initiated within a predetermined length of time period—e.g., 4 to 6 minutes—after completion of its previous dummy polishing in the viewpoint of avoiding alteration of the Cu complexes created. If much time is elapsed then it is preferable that the dummy polishing with the supply of the polish liquid 540 and Cu solution 542 is redone, followed by the start of the substrate surface polishing within the predetermined time period.

Examples of the Cu solution 542 other than the copper sulfate solution include, but not limited to, a copper cyanide solution, copper pyrophosphate solution, and mixed solution with copper dissolved in ammonia. In the polish liquid 540, examples of the complex-forming agent other than the quinaldic acid are benzotriazole, alanine, glycine, maleic acid, oxalic acid, citric acid, malic acid, and malonic acid. Examples of the oxidizer other than the ammonium persulfate are kalium persulfide, hydrogen peroxide, ferric nitrate, ammonium-cerium nitrate, ferric sulfide, ozone and kalium periodate. Additionally the polish liquid to be supplied during the pre-polish treatment in this embodiment is not an exclusive one and may be replaced by the Cu solution 542 and a solution of complex-forming agent when the need arises.

Also note that more than 0.03 grams (g) of Cu may be supplied to the polishing pad 525 of 600 mm diameter for use during the polishing of a 200 mm-diameter silicon wafer. Also supplied is an appropriate amount of complex creation agent, which is large enough to permit reaction with such Cu to create the intended complexes. The feed amounts of Cu and complex creator are adequately adjustable in proportion to the surface area of the polishing pad 525.

Although in the above-stated example the surface polishing of the substrate 200 which is a sample of the lot products is performed without supplying the Cu solution 542, this Cu solution may be supplied if necessary.

Figure 11:
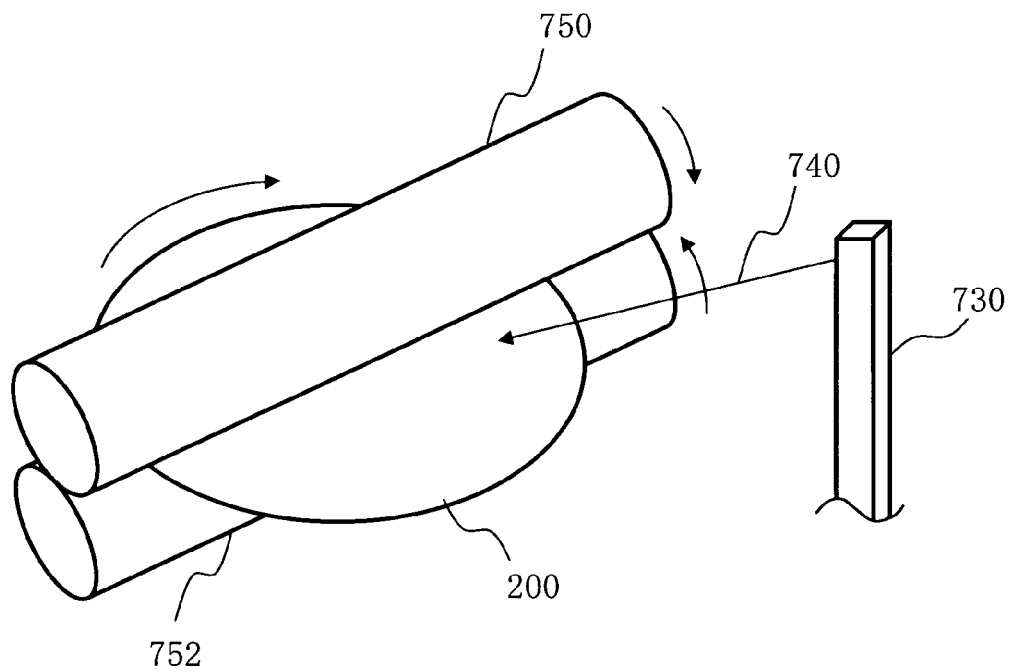
FIG. 11 is a conceptual diagram showing one example of the arrangement of a cleaning apparatus.

FIG. 11 shows a perspective view of main part of one example of cleaning machinery.

After completion of the polishing, the substrate 200 is subject to a cleaning process, which is part of a post-CMP cleaning treatment. In this step, a supporting tool (not shown) is used to hold the substrate 200 while causing its polished surface to turn up. Then, rotate the substrate 200 by rotation of a rotary shaft (not shown). Simultaneously, supply thereto a cleaning liquid 740 from a feed port 730 shown in FIG. 11. The substrate 200 is inserted between a pair of self-rotating brush rollers 750 and 752 so that it is held tight by these rollers for brush-scribing.

Figure 12:
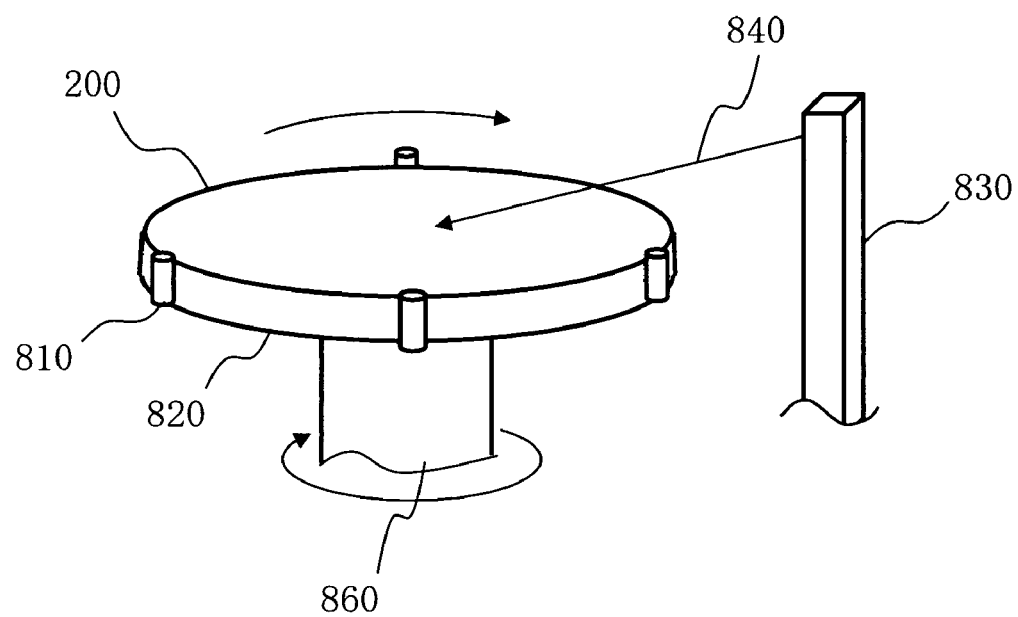
FIG. 12 is a conceptual diagram showing one example of the arrangement of another cleaning apparatus.

FIG. 12 is a perspective view of another exemplary cleaning tool.

As shown in FIG. 12, the brush-scribe cleaning (also called the roll-brush washing) shown in FIG. 11 is followed by a rinsing process step, which mounts and holds the substrate 200 by a set of four supporting members 810 that are disposed on the round edge of a turn table 820. While rotating the turn table 820 by rotation of a rotary shaft 860 to thereby rotate the substrate 200, pure water 840 is supplied thereto from a feed port 830 so that rinse washing is performed. Although only its upper surface is subjected to the rinse cleaning, both surfaces may be rinsed together.

Then, a second metal polishing process is performed, which is part of the polishing process at step S120 of FIG. 1. In the second metal polishing, CMP is used to apply touch-up polishing to the surface of substrate 200 while at the same time suppressing both the Cu's dishing and the dielectric film's erosion to a level of less than 20 nm for example, followed by removal of those portions of the barrier metal film 240 which are deposited on the surface of SiOC film 222 other than the holes as defined therein to thereby achieve surface planarization, resulting in formation of a Cu wiring metal-buried or "embedded" structure shown in FIG. 4C.

Note here that in the pre-polish treatment, with the polish method of pre-polishing an oxide film as a dummy substrate without the supply of the Cu solution 542 for consecutively polishing Cu-added sample substrates at the first metal polishing which is part of the polishing process, evaluation of the shape of a sample immediately after the dummy polishing was carried out to reveal the fact that the erosion of 70-μm wiring portions with a coverage of 90% is 30 nm. On the contrary, with the embodiment method of pre-polishing an oxide film as the dummy substrate while simultaneously supplying thereto the Cu solution 542 and the polish liquid 540 for consecutively polishing Cu-added sample substrates at the first metal polishing which is part of the polishing process, the shape of a sample immediately after the dummy polishing was evaluated so that the erosion of 70-μm wiring portions with its coverage of 90% is 15 nm. This demonstrates that the embodiment method offers its ability to suppress the erosion more successfully.

Although in the above example the substrate 300 is used as a dummy substrate while causing the polish liquid 540 and Cu solution 542 to spread on the polishing pad 525, this approach is not to be construed as limiting the invention.

Figure 13:
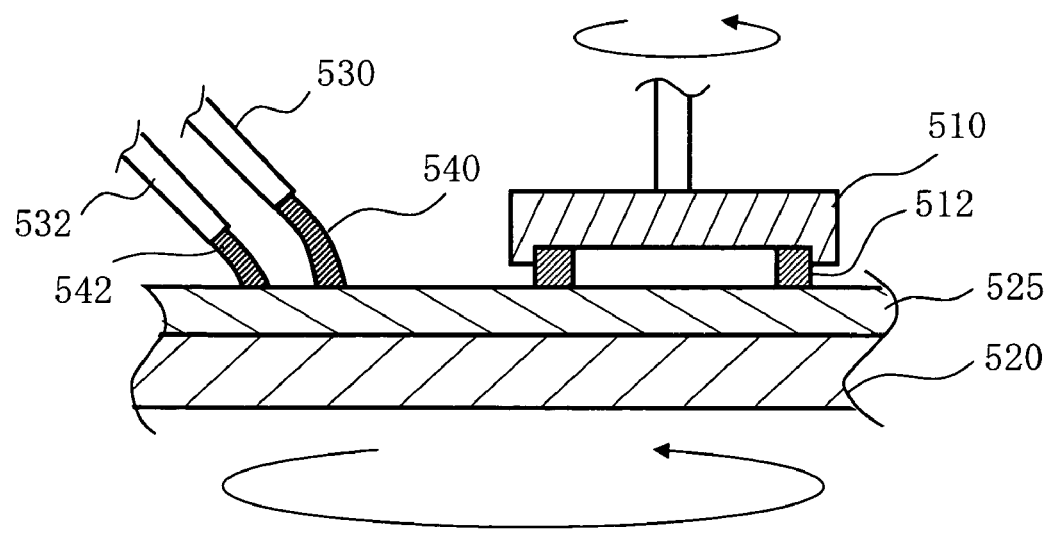
FIG. 13 is a diagram for explanation of another technique for spreading a Cu solution and a polishing liquid on the polishing pad in a pre-polishing treatment process.

Another approach to spreading the polish liquid and Cu solution on the polishing pad in the pre-polish treatment process is shown in FIG. 13.

As shown in FIG. 13, the substrate 300 of FIG. 8 is out of use. The carrier 510 has at its bottom face a retainer ring 512 (one example of the ring-like member) which is formed to have a ring-like shape. While pressing only the retainer ring 512 against the top surface of polishing pad 525, the turn table 520 with this cloth 525 pasted thereto is driven to rotate. In this state, the polish liquid 540 and Cu solution 542 are supplied onto the polishing pad 525. With such an arrangement, it is possible by the retainer ring 512's outer periphery surface or bottom face to well spread or "diffuse" the Cu solution 542 and polish liquid 540 on the overall surface of polishing pad 525. This enables creation of Cu complexes (Cu—R) on the entire surface of polishing pad 525 while permitting uniform coverage of the entirety of the polishing pad 525. Using the retainer ring 512 avoids the need to prepare the dummy substrate.

Embodiment 2

While in Embodiment 1 the Cu complex (Cu—R) is formed by supply of the Cu solution 542 at the pre-polishing treatment step S118 of FIG. 1, Embodiment 2 is arranged to employ another scheme for forming such Cu complex (Cu—R) in a way as will be set forth below. This embodiment is similar to Embodiment 1 in those processes other than the pre-polish treatment, so explanations thereof will be eliminated herein.

Figure 14:
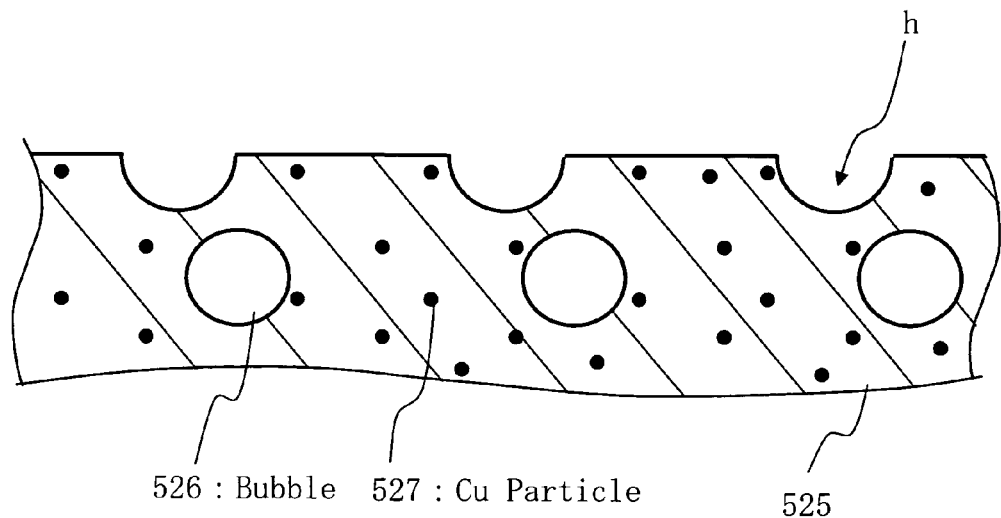
FIG. 14 is a conceptual diagram showing a cross-sectional structure of a polishing pad in Embodiment 2.

FIG. 14 illustrates, in cross-section, a polishing pad as used in Embodiment 2.

As shown in FIG. 14, the polishing pad 525 is pretreated to contain Cu particles 527. Preferably, these Cu particles 527 are 0.1 to 100 kg/m$^3$ (i.e., 0.1 to 100 mg/cm$^3$) in concentration. The Cu particles 527 are specifically designed to be sufficiently smaller in size than the gas bubbles 526 (50 to 100 μm)—for example, 1 μm or less. With such particle size setting, it is possible to prevent occurrence of scratches during polishing.

Figure 15:
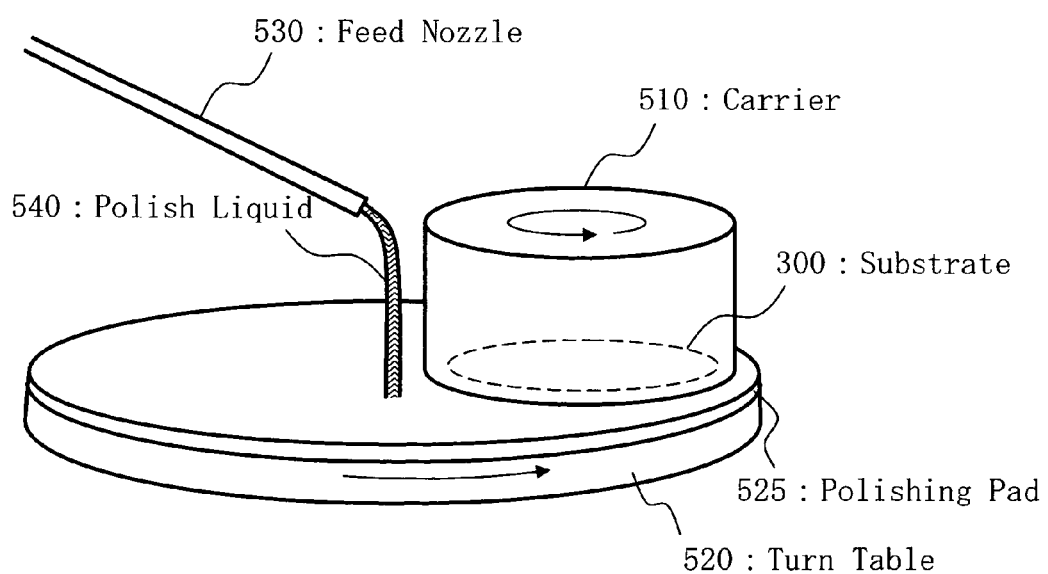
FIG. 15 is a conceptual diagram showing one example of a configuration of CMP equipment.

FIG. 15 is a perspective view of an exemplary structure of CMP equipment.

In FIG. 15, a rotary type CMP equipment which is one example of the polishing equipment has a turn table 520 having its top surface on which a polishing pad 525 and a carrier 510 are disposed. The carrier 510 supports a dummy substrate 300 having its surface on which a silicon oxide film is formed by way of example while causing its to-be-polished surface to face downward. After having supplied pure water from a water feed nozzle (not shown) onto the polishing pad 525 to flow thereon, a polishing liquid 540 which is an example of the chemical liquid is supplied from a feed nozzle 530 at the supply step. Rotating the carrier 510 causes the substrate 300 to rotate, thus driving the turn table 520 to rotate. The polish liquid 540 is fed to drop down onto the polishing pad 525 at a specific position that is adjacent to a near side of the substrate 300 which is placed at a far end of the rotation direction of turn table 520 whereby the polish liquid 540 coats the surface. After having completed the dummy polishing using the polish liquid 540, pure water is fed from the water feed nozzle (not shown) to flow on the surface of polishing pad 525 for replacement of the polish liquid 540. This arrangement is similar to Embodiment 1 except that the Cu solution 542 is not supplied. And, it is similar to Embodiment 1 in that the conditioning is performed by fabric-raising of the polishing pad 525 that is clogged due to dummy polishing while pressing it against the rotating polishing pad 525 and at the same time rotating the dresser 310 of CMP equipment shown in FIG. 7 in the conditioning process after completion of the dummy polishing using the polish liquid 540.

Figure 16:
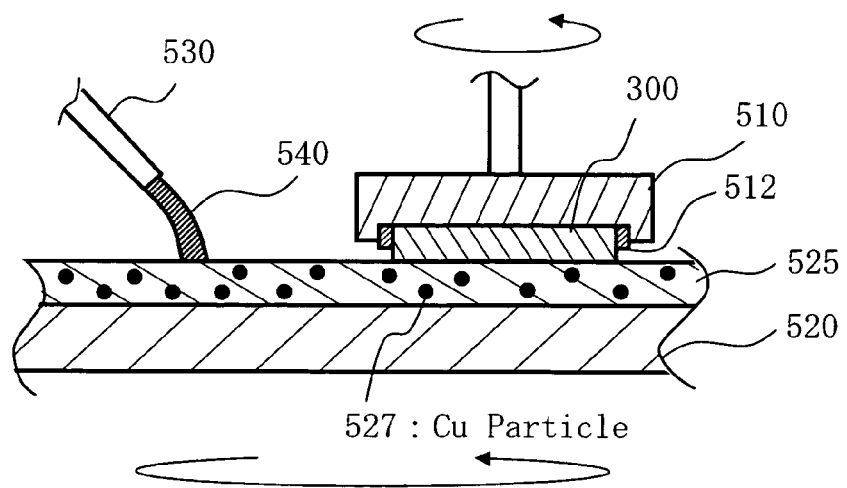
FIG. 16 is a conceptual diagram showing a cross-sectional structure of the CMP equipment shown in FIG. 15.

FIG. 16 shows a cross-sectional view of the turn table structure of CMP equipment shown in FIG. 15.

The polishing pad-padded turn table 520 with Cu particles 527 being contained in the polishing pad 525 is driven to rotate at a rate of 10 to 150 $min^{-1}$ (rpm) and come into contact with the polishing pad 525 with the aid of the carrier 510 that holds the substrate 300 under the application of a polishing load P of $9.8 \times 10^3$ to $6.9 \times 10^4$ Pa (100 to 700 $gf/cm^2$). The carrier 510's rotation number was set to 10 to 120 rpm. The polish liquid 540 was supplied from the feed nozzle 530 onto the polishing pad 525 with a flow rate of 0.05 to 0.3 L/min (50 to 300 cc/min). The polishing pad 525 used was Rodel IC1000. The polishing time was set to a time duration capable of entirely removing by polishing the Cu film 260 and its underlying film 250 above the surface of substrate 200 in the first metal polishing process to be later executed. Furthermore, overpolishing of +30% was performed.

Similarly to Embodiment 1, an example of the polish liquid 540 is a mixture of 0.3 wt % of quinaldic acid which acts as a complex creation agent, 0.1 wt % of organic acid, e.g., oxalic acid, 0.6 wt % of colloidal silica which becomes abrasive particles, 0.05 wt % of polyoxyethylene-alkyl-ether acting as an interfacial activator or "detergent," and 1.5 wt % of ammonium persulfate for use as an oxidizer, which are blended with pure water. This blended polisher is adjusted by potassium hydroxide (KOH) to a level of pH9.

Figure 17:
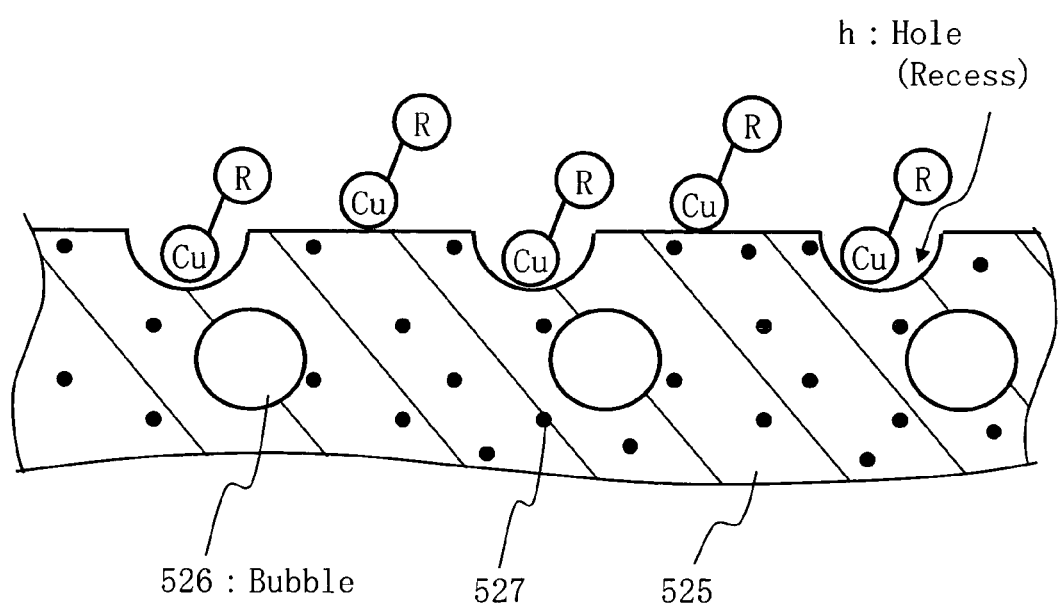
FIG. 17 is a conceptual diagram showing a cross-section of the polishing pad.

FIG. 17 is a pictorial representation of a partial cross-section of the polishing pad 525 used for the Cu polishing, which contains therein the Cu particles 527.

The Cu particle-containing polishing pad 525 is made of a polyurethane-based material for example, which has therein gas bubbles 526 with a size of 50 to 100 μm. In a surface of the polishing pad 252 as cut along a certain plane, holes h (recesses) are formed due to outward release of gas bubbles 526. When rotating the carrier 510 and turn table 520 while supplying the polish liquid 540 onto the polishing pad 525, such liquid 540 uniformly coats the entire surface of the polishing pad 525 with the aid of the substrate 300. And, the Cu particles 527 in the surface of polishing pad 525 are oxidized by ammonium persulfide acting as the oxidizer in the polish liquid 527. The Cu particles 527 thus oxidized react with the quinaldic acid acting as the complex-forming agent in the polish liquid 540, resulting in creation of an adequate amount of Cu complex (Cu—R), which is one example of the Cu-containing material, on the polishing pad 525 as shown in FIG. 17.

Figure 18:
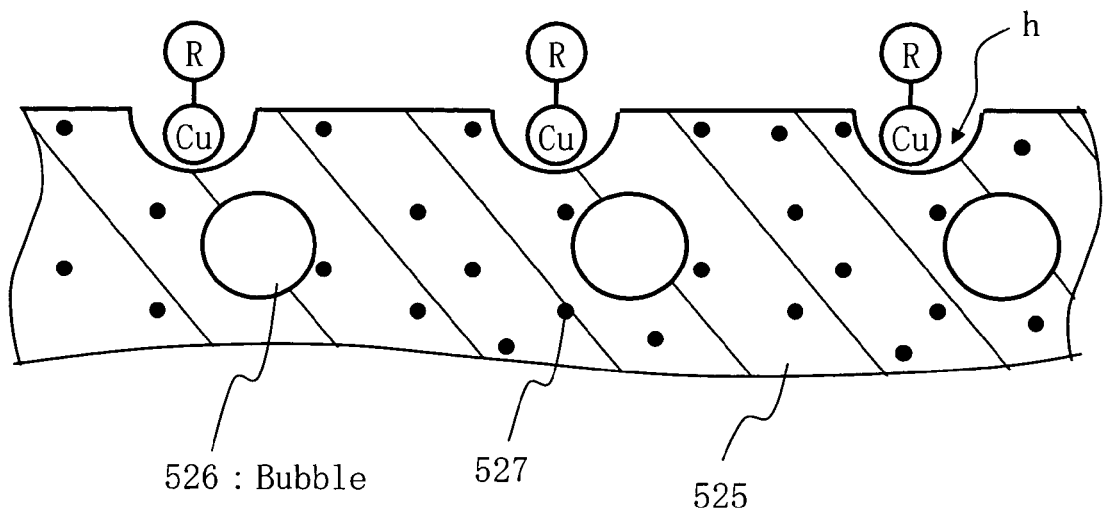
FIG. 18 is a conceptual diagram showing a cross-section of the polishing pad after the conditioning.

FIG. 18 shows a partial cross-section of the polishing pad after completion of the conditioning process.

Owing to the conditioning after the dummy polishing, almost entire part of the Cu-containing material—here, Cu complex (Cu—R)—is removed away from the surface of the polishing pad 525 while few portions thereof reside within the surface recesses h of this polishing pad 525 in a state that these are precipitated at the bottom faces of such recesses as shown in FIG. 18. In this state, surface polishing is applied to the substrate 200, which is a sample of the lot products.

Firstly, at the first metal polishing which is part of the polishing step, the substrate 200 is surface-polished by CMP techniques in such a way that the polishing stops at the barrier metal film 240 while controlling the Cu polish rate to stay at 1000 nm/min, for example, and also suppressing Cu's dishing at 20 nm or less, thereby to remove the Cu film 260 and seed film 250 as have been deposited on those surface portions of the SiOC film 222 other than the holes. The surface polish conditions of the substrate 200 that is a sample of the lot products are similar to those in the dummy polishing, so repetitive explanations are eliminated herein.

After having completed the surface polishing of the first substrate 200 and the conditioning for fabric raising of the polishing pad 525, a set of surface polishing and conditioning processes is applied to a second substrate 200 in the lot, followed by execution of a set of similar processes in succession for a third substrate 200. The same goes with the remaining substrates in the lot so that each substrate of the lot is surface-polished sequentially. Even in the polishing processes of the second substrate 200 and third substrate 200 et seq., the Cu complexes (Cu—R) which were formed during the dummy polishing or Cu polishing remain at the bottoms of the surface recesses h of polishing pad 525, so it is possible to suppress unwanted film peel-off in a similar way to the first substrate 200.

Then, after completion of the first metal polishing and cleaning processes, a second metal polishing process is performed, which is part of the polishing process. In the second metal polishing, CMP is used to apply touch-up polishing to the surface of substrate 200 while at the same time suppressing both the Cu's dishing and the dielectric film's erosion to a level of less than 20 nm for example, followed by removal of those portions of the barrier metal film 240 which are deposited on the surface of SiOC film 222 other than the holes as defined therein to thereby achieve surface planarization, resulting in formation of a Cu wiring metal-embedded structure such as shown in FIG. 4C.

With alternative use of the above-noted scheme for forming the Cu complex (Cu—R) by causing the polishing pad 525 to contain in advance the Cu particles 527 as an alternative to supplying the Cu solution 542, it is possible to obtain similar advantages to those of Embodiment 1. Additionally, in place of the polish liquid 540, a solution with a blend of an oxidizer and a complex-forming agent may be supplied onto the Cu particle-containing polishing pad 525. Using this scheme also, it is possible to form the Cu complex (Cu—R).

Although in the above description the substrate 300 is used as a dummy substrate while causing the polish liquid 540 to spread on the polishing pad 525, this approach is not to be construed as limiting the invention.

Figure 19:
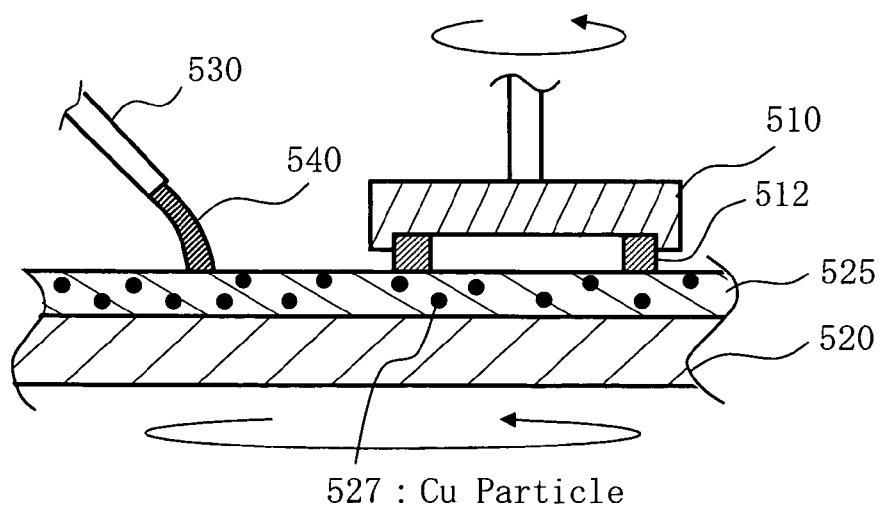
FIG. 19 is a diagram for explanation of another scheme for spreading a polishing liquid on polishing pad during pre-polish treatment.

Another scheme for spreading the polish liquid on the polishing pad in the pre-polish treatment process is shown in FIG. 19.

As shown in FIG. 19, it is also preferable in a similar way to Embodiment 1 to supply the polish liquid 540 onto the polishing pad 525 while pressing, without the use of the substrate 300, only a ring-like retainer ring 512 of the carrier 510 against the surface of polishing pad 525. With such an arrangement, it is possible by the retainer ring 512's outer periphery surface or bottom face to well spread or "diffuse" the polish liquid 540 on the overall surface of polishing pad 525. This enables creation of Cu complex (Cu—R) on the entire surface of polishing pad 525 while permitting uniform coverage of the entirety of the polishing pad 525. Using the retainer ring 512 avoids the need to prepare the dummy substrate.

Embodiment 3

A semiconductor device fabrication method in Embodiment 3 and an apparatus constitution for use therewith are similar to those of Embodiment 1 except for the points set forth below. So, its differences from Embodiment 1 will be explained below.

Figure 20:
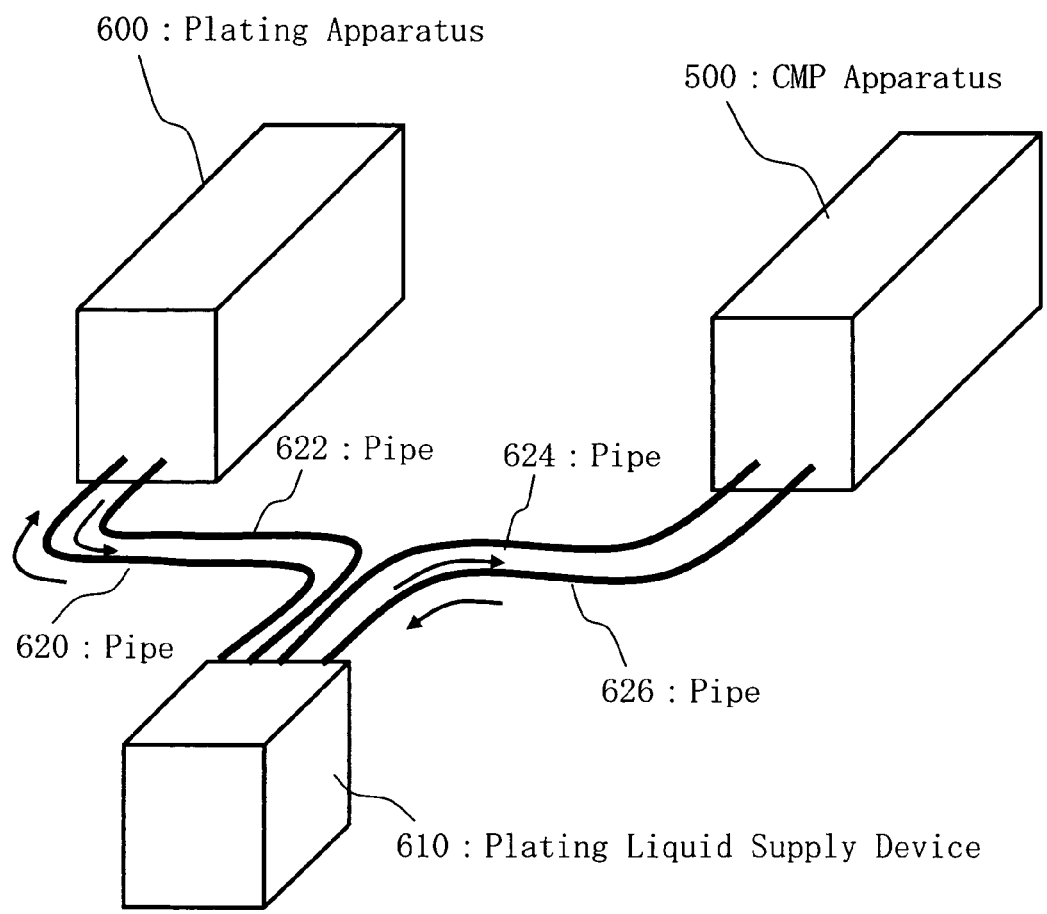
FIG. 20 is a conceptual diagram showing an apparatus configuration in Embodiment 3.

FIG. 20 pictorially shows a configuration of main part of a semiconductor device fabrication system in Embodiment 3.

In FIG. 20, a metal plating apparatus 600 performs a plating process in such a way as to dip the surface of a substrate 200 into a copper-containing plating liquid as supplied from a plating liquid supply device 610 via a delivery pipe 620 and then deposit, by electrochemical growth techniques such as electrolytic plating, a thin-film of Cu film 260 in holes 150 and on a top surface of substrate 200 with a seed film 250 being as a cathode pole. And, the used plating liquid is returned to the plating liquid supply device 610 through a pipe 622; then, adjustment is performed for quality governing of the plating liquid at the plating liquid supply device 610. The plating liquid may be a currently available liquid used for Cu plating. For example, a liquid with a copper sulfate solution as its main constituent is preferably employable, although this is not an exclusive example.

And, a CMP apparatus 500 supplies, in a pre-polishing treatment process, the copper-containing plating liquid that was supplied from the plating liquid supply device 610 via the pipe 624 onto a polishing pad 525 while simultaneously supplying thereto a polishing liquid 540 (supply step), and then performs dummy polishing by use of a dummy substrate 300 having its surface on which a silicon oxide film is formed (dummy polish step). Then, perform a conditioning process for fabric raising or "refreshing" of the polishing pad 525. Thereafter, in a polish process, substrate surface polishing and conditioning processes is performed, wherein the former is to polish the Cu thinfilm such as Cu film 260 which has been plated on the surface of a forehand (first) substrate 200 of a plurality of sample substrates 200 that are lot products by use of the polishing pad 525 having its entire surface on which Cu complexes (Cu—R) are formed whereas the latter is for fabric raising of the polishing pad 525. Subsequently, it is performed in succession a combination of substrate polishing and conditioning processes for a second substrate 200, a set of substrate polishing and conditioning processes for a third substrate 200, et seq., thereby polishing respective substrates of the lot products.

In the way stated above, it is preferable to use a pipeline system which is designed to commonize the copper ion supply line for supplying the Cu solution 542 for use in the CMP apparatus 500 with the plating liquid supply line of the plating apparatus 600. It is also preferable, as shown in FIG. 20, to provide an arrangement for returning a plating liquid which is mixed with the polish liquid 540 that has been used by the CMP apparatus 500 to the plating liquid supply device 610 via a pipe 626 for execution of waste liquid processing. Furthermore, it is preferable to arrange so that the plating liquid that has been used by the plating machine 600 is fed to the CMP apparatus 500 because it is possible to sufficiently purvey the amount of Cu in the plating liquid as needed for CMP apparatus 500 in the pre-polish treatment process by the Cu amount in the plating liquid that has been used by the plating machine 600.

As apparent from the foregoing, pre-formation of Cu complex (Cu—R) on the polishing pad 525 prior to the substrate surface polishing results in the polish friction becoming smaller, which in turn makes it possible to prevent occurrence of film stripping or peel-off during substrate surface polishing processes even in cases where Cu wires are formed on or above a low-dielectric-constant or "low-k" insulative material that is less in mechanical strength.

Note here that it is possible to form Cu complex (Cu—R) on the polishing pad 525 even when performing the dummy polishing while supplying the polish liquid 540 by using a Cu-added substrate as the dummy substrate 300. However, actual use of such Cu-added substrate as the dummy substrate does not come without accompanying disadvantages as to increases in maintenance complexity and production cost. According to the arrangement of each of the embodiments stated supra, it is possible to form the Cu complex (Cu—R) on the polishing pad 525 without the use of such Cu-added dummy substrate. As a result, it is possible to fabricate, by a simplified method at low costs, high-reliability semiconductor devices with Cu wires while eliminating the use of the Cu-added substrate as a dummy wafer.

As stated above, according to each embodiment, it is possible to lessen the friction resistance between a substrate and its associated polishing pad. This makes it possible to avoid film peel-off with respect to a film(s) on or above the substrate.

Embodiments of this invention have been described above while referring to some practical examples. But, this invention should not exclusively be limited only to these practical examples.

In addition, regarding the film thickness of the interlayer dielectric film along with the size, shape and number of the holes, the ones that are needed in semiconductor integrated circuit chips and/or semiconductor circuit elements may be adequately chosen and used on a case-by-case basis.

Any other semiconductor device fabrication methods and polishing methods which incorporate the principles of this invention and which are design-alterable by those skilled in the art should be interpreted to fall within the scope of the invention.

Additionally, although explanations as to those techniques and schemes which are usually employed in the semiconductor industry—e.g., photolithography processes, pre- and post-cleaning processes, and like processes—are omitted for brevity of the description, it is needless to say that such processes are includable in the coverage of the invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for fabricating a semiconductor device comprising:
    forming a copper film above a surface of a substrate;
    forming on a polishing pad a water-insoluble copper complex, wherein the copper of said copper complex does not derive from said copper film; and
    after having formed said water-insoluble copper complex on said polishing pad, polishing said copper film by use of said polishing pad,
    wherein when forming said copper complex, a dummy substrate different from said substrate is polished by said polishing pad while supplying a copper solution and a prespecified chemical liquid onto said polishing pad.

2. The method according to claim 1, wherein said dummy substrate is subjected to polishing using said polishing pad without formation of a copper film on a surface thereof.

3. The method according to claim 1, wherein when forming said copper complex, fabric raising of said polishing pad is performed after having polished said dummy substrate.

4. The method according to claim 1, wherein said prespecified chemical liquid includes therein a complex creation agent.

5. A method for fabricating a semiconductor device comprising:
    forming a copper film above a surface of a substrate;
    forming, on a polishing pad, a water-insoluble copper complex, wherein the copper of said copper complex does not derive from said copper film; and
    after having formed said water-insoluble copper complex on said polishing pad, polishing said copper film by use of said polishing pad,
    wherein when forming said copper complex, a copper solution and a prespecified chemical liquid are supplied onto said polishing pad, and a ring-like member is used to spread said copper solution and said prespecified chemical liquid on said polishing pad without use of said substrate.

6. The method according to claim 5, wherein when forming said copper complex, said ring-like member is pressed onto said polishing pad being driven to rotate while supplying thereto said copper solution and said prespecified chemical liquid.

7. The method according to claim 6, wherein said ring-like member is disposed at a holder unit configured to hold said substrate when polishing said copper film.

8. A method of fabricating a semiconductor device comprising:
    plating a copper film above a surface of a substrate by using a copper-containing plating liquid supplied from a plating liquid supply device;
    after having plated said copper film, supplying said copper-containing plating liquid from said plating liquid supply device and a prespecified chemical liquid onto a polishing pad; and
    after having supplied said copper-containing plating liquid from said plating liquid supply device and said prespecified chemical liquid, using said polishing pad to polish said copper film as plated above the surface of said substrate.

9. The method according to claim 8, wherein prior to polishing of said copper film, a dummy substrate different from said substrate is used to spread on said polishing pad said copper-containing plating liquid and said prespecified chemical liquid thus supplied.

10. The method according to claim 8, wherein prior to the polishing of said copper film, a ring-like member is used to spread on said polishing pad said copper film, a ring-like member is used to spread on said polishing pad said copper-containing plating liquid and said prespecified chemical liquid thus supplied.

11. The method according to claim 8, wherein a liquid after use for a plating treatment is used as said copper-containing plating liquid to be supplied onto said polishing pad.

12. The method according to claim 8, wherein when polishing said copper film, said copper-containing plating liquid is not supplied onto said polishing pad.

13. A polishing method comprising:
    forming a water-insoluble copper complex on a polishing pad; and
    after formation of said water-insoluble copper complex on said polishing pad, using said polishing pad to start sequential surface polishing for a plurality of substrates having a substantially identical structure with a copper film being formed above a surface thereof,
    wherein forming said water-insoluble copper complex is not performed at each interval between each polishing of said plurality of substrates, and
    wherein when forming the water-insoluble copper complex, a dummy substrate different from the plurality of substrates is polished by the polishing Dad while supplying a copper solution and a prespecified chemical liguid onto the polishing pad.

14. The method according to claim 13, wherein said prespecified chemical liquid includes an oxidizer and a complex creation agent.

15. The method according to claim 13, wherein when forming said water-insoluble copper complex, fabric raising of said polishing pad is performed after having polished said dummy substrate.

16. The method according to claim 13, wherein said prespecified chemical liquid includes a complex creation agent.

* * * * *

UNITED STATES PATENT AND TRADEMARK OFFICE
CERTIFICATE OF CORRECTION

PATENT NO. : 7,494,931 B2  Page 1 of 1
APPLICATION NO. : 11/526671
DATED : February 24, 2009
INVENTOR(S) : Fukushima et al.

It is certified that error appears in the above-identified patent and that said Letters Patent is hereby corrected as shown below:

Claim 13, column 16, line 40, change "Dad" to --pad--.

Claim 13, column 16, line 42, change "liguid" to --liquid--.

Signed and Sealed this

Twenty-first Day of April, 2009

JOHN DOLL
*Acting Director of the United States Patent and Trademark Office*